United States Patent
Xue

(10) Patent No.: US 7,598,767 B1
(45) Date of Patent: Oct. 6, 2009

(54) MULTI-STANDARD DATA COMMUNICATION INTERFACE CIRCUITRY FOR PROGRAMMABLE LOGIC DEVICES

(75) Inventor: Ning Xue, Fremont, CA (US)

(73) Assignee: Altera Corporation, San Jose, CA (US)

( * ) Notice: Subject to any disclaimer, the term of this patent is extended or adjusted under 35 U.S.C. 154(b) by 557 days.

(21) Appl. No.: 11/349,411

(22) Filed: Feb. 6, 2006

Related U.S. Application Data

(63) Continuation of application No. 11/303,807, filed on Dec. 15, 2005, now abandoned.

(60) Provisional application No. 60/707,616, filed on Aug. 12, 2005.

(51) Int. Cl.
*H03K 19/173* (2006.01)
(52) U.S. Cl. .......................... 326/37; 714/799
(58) Field of Classification Search ................ 370/464, 370/498, 503, 505, 506; 714/699, 704, 799, 714/724, 725; 326/37
See application file for complete search history.

(56) References Cited

U.S. PATENT DOCUMENTS

| 4,486,739 A | 12/1984 | Franaszek et al. |
| 2003/0052709 A1* | 3/2003 | Venkata et al. ................. 326/37 |
| 2007/0168770 A1* | 7/2007 | Fan et al. ..................... 714/704 |

\* cited by examiner

*Primary Examiner*—William Trost, IV
*Assistant Examiner*—Siming Liu
(74) *Attorney, Agent, or Firm*—Ropes & Gray LLP; Robert R. Jackson

(57) ABSTRACT

A programmable logic device includes a hard IP portion, which includes circuitry that is dedicated to receiving a high-speed serial data signal and performing certain basic functions related to byte alignment on that data signal, and a more general-purpose programmable logic portion. The programmable logic portion is used for such tasks as synchronizing the byte-aligned data in accordance with any one of a number of possible data communication protocols.

21 Claims, 2 Drawing Sheets

MULTI-STANDARD DATA COMMUNICATION INTERFACE CIRCUITRY FOR PROGRAMMABLE LOGIC DEVICES

This is a continuation of U.S. patent application Ser. No. 11/303,807, filed Dec. 15, 2005, which is hereby incorporated by reference herein in its entirety. This application also claims the benefit of U.S. provisional patent application 60/707,616 filed Aug. 12, 2005, which is also hereby incorporated by reference herein in its entirety.

BACKGROUND OF THE INVENTION

This invention relates to programmable logic devices ("PLDs") or the like, and more particularly to PLD circuitry that facilitates use of the PLD to support any of many different data communication protocols, especially protocols that involve the use of one or more high-speed serial data streams.

High-speed serial data communication is increasingly of interest, e.g., for signaling between various devices in a system such as integrated circuits on a printed circuit board. The speed at which such communication is desired is constantly increasing, and the known standards or protocols for such communication are also proliferating. Examples of some of these standards or protocols are Gigabit Ethernet, XAUI, FC, SRIO, PCI-Express, etc. Currently, data rates in the range of about 6 gigabits per second are being employed; but this is only an example, and faster or slower data rates may also be employed. As an alternative to protocols that are more or less industry standards, some system designers may want to design their own custom protocols.

PLDs are typically intended to be relatively general-purpose devices. As such, it is desirable for a PLD to be able to support as many different communication protocols as is reasonably feasible. This is made more difficult by both of the trends noted above, i.e., increased communication speed and increased number of possible communication protocols. High speed suggests a need for dedicated circuitry. However, increased number of possible protocols suggests that a large amount of dedicated circuitry will be needed (to support the peculiarities of each possible protocol), but that much of that circuitry will be unused and therefore wasted when the PLD is used for only one or at most a few of the possible protocols.

SUMMARY OF THE INVENTION

In accordance with the invention, a programmable logic device ("PLD") has a hard IP portion and a more general-purpose programmable logic portion. The hard IP portion includes circuitry that is dedicated to receiving a serial data signal and performing certain basic tasks on that signal. These tasks may include byte alignment and certain commonly employed checks on the resulting bytes. For example, the bytes may be checked for correspondence to a particular byte code, and/or a current running disparity ("CRD") check may be performed on the bytes. These checks are preferably performed immediately or at least closely downstream from the byte alignment circuitry, and before significant delay is introduced by other circuitry that further processes the aligned bytes.

The aligned bytes and output signals of the hard IP circuitry performing checks of the aligned bytes as described in the preceding paragraph are applied to downstream circuitry. This downstream circuitry may include additional dedicated data processing circuitry in the hard IP portion of the PLD. The downstream circuitry also includes the programmable logic portion of the PLD. That programmable logic is typically configured (programmed) to perform tasks on the aligned bytes that tend to have relatively large variation among a wide range of communication protocols that can be implemented by the PLD. For example, these tasks typically include synchronizing the bytes in accordance with the data structure of whatever communication protocol is being implemented. As part of its tasks, the programmable logic may feed back to the hard IP signals for affecting how the bytes are being aligned in the hard IP. To increase the speed at which a change in byte alignment can be made, the programmable logic can enable the byte alignment circuitry in the hard IP to respond directly to code or CRD errors detected far upstream in the hard IP as described in the preceding paragraph. The hard IP preferably operates on two bytes at a time.

Further features of the invention, its nature and various advantages, will be more apparent from the accompanying drawings and the following detailed description.

DETAILED DESCRIPTION

Figure 1:
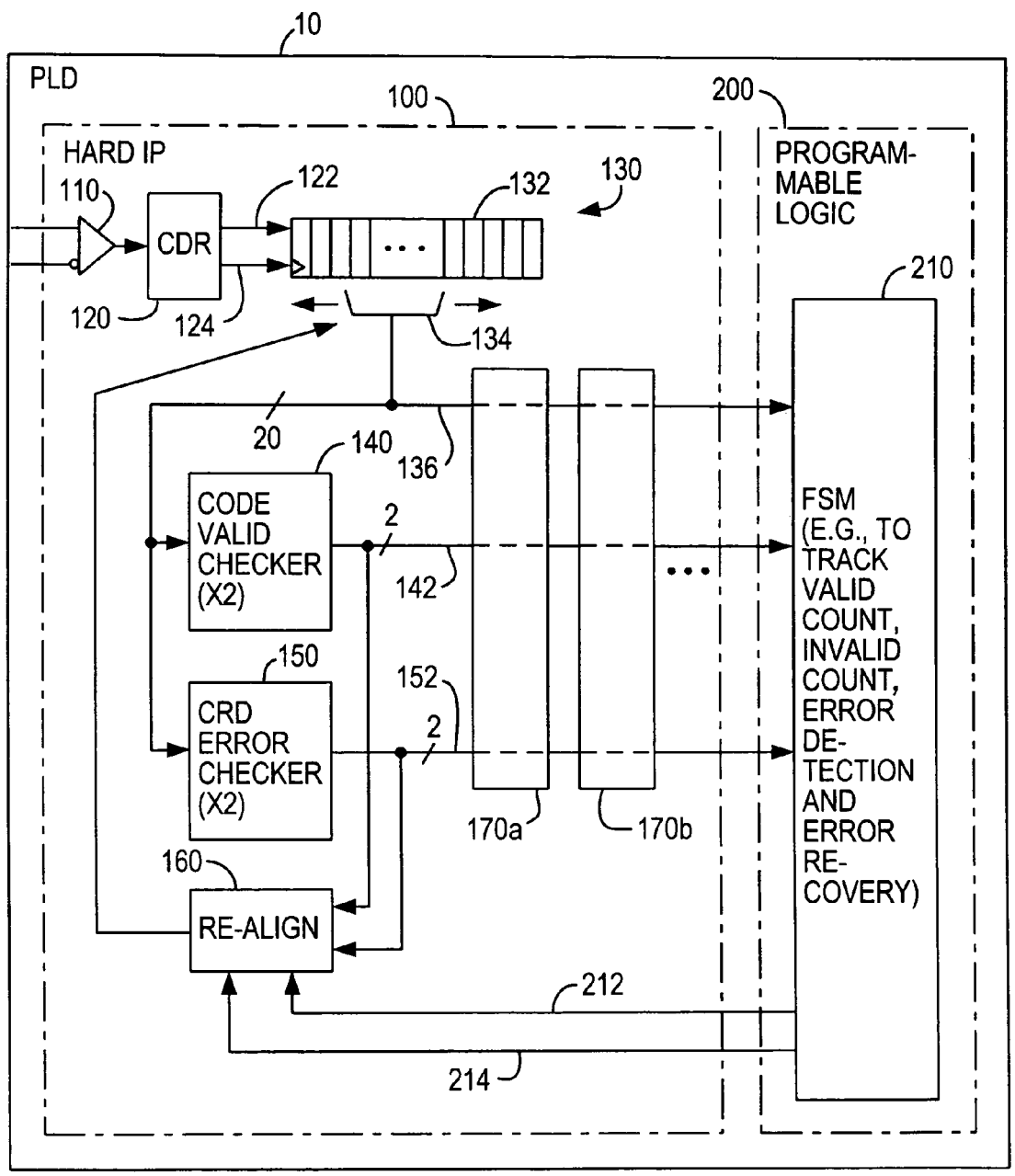
FIG. 1 is a simplified schematic block diagram of an illustrative embodiment of circuitry constructed in accordance with the invention.

In the illustrative embodiment shown in FIG. 1 the invention is implemented in a PLD 10. PLD 10 has two principal parts that are relevant to the invention. These are hard IP (intellectual property) part 100 and programmable logic part 200. Hard IP 100 includes circuitry that is at least partly hard-wired to perform particular, relatively high-level functions. Certain aspects of these functions may be programmable or otherwise variably controllable. But the basic type(s) of these functions is fixed. Another term for this type of circuitry is dedicated (i.e., because the circuitry is dedicated to performing particular functions and cannot be used for performing other functions).

Programmable logic 200 is traditionally the major part of a PLD. It is relatively general-purpose circuitry that can be programmed to perform any of a wide range of functions.

Hard IP 100 includes serial data signal input buffer circuitry 110 for receiving a serial data signal from a source external to PLD 10. Buffer 110 is shown as able to receive a differential input signal pair; but that is optional, and the input buffer could alternatively receive a single-ended input signal if desired.

After appropriate buffering (which may include equalization), buffer 110 applies the serial data signal information it receives to clock and data recovery ("CDR") circuitry 120.

CDR circuitry 120 recovers from the applied serial data information a re-timed serial data signal on lead 122 and a recovered clock signal on lead 124. This is a conventional operation that will need no further explanation to those skilled in the art.

Signals 122 and 124 are applied to alignment circuitry 130. For example, alignment circuitry 130 may include an input shift register portion 132 and an output selection portion 134. Input shift register portion 132 shifts re-timed serial data signal 122 into and along that portion in synchronism with recovered clock signal 124. For example, if circuitry 130 is set up to handle bytes of data of ten bits each, shift register portion 132 may include approximately 30 shift register stages for holding that number of bits.

Continuing with the example begun in the preceding paragraph, output portion 134 can select any of 20 adjacent stages of shift register 132 as the sources for 20 parallel data output signals 136. Output portion 134 is controlled by re-align circuitry 160 to select which 20 adjacent bits in shift register 132 portion 134 will output. Output portion 134 is strobed at one-twentieth the serial data bit-rate to produce its 20 bits of parallel output at one-twentieth the serial data bit-rate. In other words, output portion 134 produces 20 bits of parallel data output after every 20 bits of serial data input to shift register 132. The output clock rate of alignment circuitry 130 is therefore one-twentieth the rate of bit-rate clock signal 124. The output clock rate of alignment circuitry 130 may be referred to as a two-byte clock rate signal (because its period corresponds to the duration of two bytes of parallel data on the output leads 136 of circuitry 130).

The 20 parallel bits 136 output by alignment circuitry 130 are applied to the following other components in hard IP 100: code valid checker circuits 140, CRD (current running disparity) error checker circuits 150, and (possibly) one or more of data processing modules 170a, 170b, etc. Eventually the information contained in bits 136 is applied to the programmable logic portion 200 of PLD 10. Examples of functions that may be performed by hard IP data processing modules 170 include channel deskew, rate matching, 8B10B decoding, data width adjustment for interfacing with circuitry 200, etc. Deskew is eliminating differential delay between two or more data channels that are supposed to be operating in synchronism. Rate matching is compensating for possible frequency difference between the rate at which data is received via buffer 140 and the rate at which it is processed by programmable logic 200. 8B10B decoding is conversion of 10-bit bytes to 8-bit bytes. (See also the discussion of 8B10B coding later in this specification.) Data width adjustment may produce even more extensive byte deserialization (e.g., so that four successive bytes are applied in parallel to programmable logic 200). These are only examples, and still other hard IP modules 170 may be provided for performing other tasks. Any one or more of modules 170 may be selectively (e.g., programmably) bypassable. In other words, signals may be routed around any of modules 170 that it is not desired to use in implementing a particular communication protocol. Depending on how many and which of modules 170 are used, data may be delayed dozens of clocks in passing from the output of alignment circuitry 130 to finite state machine ("FSM") 210. It will be noted that circuitries 140 and 150 are upstream from data processing modules 170. The output signals of circuitries 140 and 150 are therefore not subject to the delays of modules 170. Indeed, some or all of modules 170 may make use of the output signals 142 and 152 of circuitries 140 and 150. Those output signals 142 and 152 are also applied to the programmable logic portion 200 of PLD 10.

Each of the two instances of circuitry 140 receives a respective ten of the 20 bits output by circuitry 130. Each of these instances of circuitry 140 is designed to detect whether the ten bits received by that instance correspond to a valid byte code. If so, the data 136 being output by circuitry 130 is properly aligned with the intended byte boundaries, and the alignment of circuitry 130 does not need to be changed. In other words, the data on leads 136 are (at least probably) two proper bytes. On the other hand, if an instance of circuitry 140 detects that the ten bits it has received from circuitry 130 do not correspond to a valid byte code, that may indicate a need to re-align alignment circuitry 130 (i.e., to shift which 20 adjacent stages of shift register 132 output portion 134 is getting bits 136 from). Each instance of circuitry 140 produces an output signal 142 indicative of whether or not it is currently receiving ten bits that correspond to a valid byte code. Signals 142 are applied to re-align control circuitry 160 in hard IP 100, and also to programmable logic portion 200. Signals 142 may also be used by any of data processing modules 170, as was mentioned in the preceding paragraph. It will be apparent (as will be discussed in more detail below), that it typically only makes sense to act on invalid code output indications 142 from circuitry 140 when PLD 10 should be receiving input information including bytes corresponding to the valid byte code.

Each of the two instances of circuitry 150 also receives a respective ten of the 20 bits output by circuitry 130. Many data communication protocols use what is called 8-bit/10-bit (or 8B10B) coding. See Franaszek et al. U.S. Pat. No. 4,486,739. 8B10B coding includes avoiding a predominance of binary 1s or binary 0s in the data signal being transmitted. 8B10B coding uses a parameter known as disparity, running disparity, or current running disparity ("CRD") to indicate whether more binary 1s or more binary 0s have been employed. For example, a signaling protocol that employs 8B10B coding may require CRD to have a certain value (positive or negative, respectively indicating more is than 0s or vice versa) at certain times during a transmission. Another alternative or additional possibility is that a signaling protocol may require CRD to reverse polarity after every byte.

Each instance of circuitry 150 can be circuitry for performing one or more basic CRD operations on the ten bits of data 136 which that instance receives. For example, each instance of circuitry 150 may determine the disparity of each ten bits it receives and test whether that disparity complies with basic disparity rules. An example of such a rule may be that disparity must be either +2, 0, or −2 (respectively indicating an excess of two 1s, equality of 1s and 0s, and an excess of two 0s). This is only an example, and each instance of circuitry 150 may alternatively or additionally check one or more other disparity rules. A violation of a disparity rule may indicate a need to re-align circuitry 130. Each instance of circuitry 150 produces an output signal 152 indicative of whether or not that instance has detected a CRD error for each successive ten bits of data that it receives. Signals 152 are applied to re-align circuitry 160 and to programmable logic circuitry 200. Signals 152 may also be used by any of data processing modules 170, as was mentioned earlier in this specification.

Although these considerations can be different for different data communication protocols, it will be appreciated that circuitry 140 tends to be useful when the data signal information being received is information like packet framing bytes, which have a predetermined code. Circuitry 140 may not produce useful output signals when the data signal information being received is true data, which can be more random in content. Circuitry 150 may be useful during both packet framing and data transmission because all such information may be expected to comply with certain basic CRD rules.

Re-align control circuitry 160, which can be part of hard IP 100, receives signals 142 and 152 from circuitries 140 and 150 as has been mentioned. Re-align control circuitry 160 also receives signals from programmable logic circuitry 200. These latter signals may include a RESYNC_ENABLE signal 212 and an AUTO_RESYNC_MODE signal 214. Re-align circuitry 160 controls which 20 adjacent stages of shift register 132 the output portion 134 of alignment circuitry 130 gets its output signals 136 from. Operation of circuitry 160 will be further described after the following discussion of programmable logic 200, and especially the portion 210 of logic 200 that is particularly relevant to this invention.

As shown in FIG. 1, a portion 210 of the relatively general-purpose, programmable logic 200 of PLD 10 is programmably configured (in use) to work with hard IP 100. (There will typically be more, perhaps much more, of programmable logic 200 that is not part of portion 210.) For example, whereas hard IP 100 effects byte alignment of the incoming serial data, programmable logic portion 210 performs what may be called synchronization of the byte-aligned data. Such synchronization includes correlating the byte-aligned data with whatever data packet structure the communication protocol being implemented employs. For example, portion 210 may function as a finite state machine ("FSM") to perform such tasks as detecting packet framing bytes, determining when packet framing bytes have ended and data has therefore begun, keeping track of how many data bytes have been received so that packet length can be checked and so that it will be known when the next packet framing bytes should be received, etc. (Portion 210 may pass the data mentioned in the preceding sentence on to other portions of programmable logic 200.) Other functions of portion 210 in accordance with the invention include making use of signals 142 and 152, and providing signals 212 and 214 at appropriate times and under appropriate conditions. These latter aspects of the operation of FSM 210 will be described in more detail later in this specification.

The functions of FSM 210 described in the preceding paragraph are particularly suitable for performance in programmable logic 200 for such reasons as the following. There are a great many data communication protocols that it may be desired to implement using PLD 10. Providing a complete hard IP solution for each of such a large number of possible protocols would be very complex. It would also be inefficient, because in any given use of PLD 10, only one solution (or at most a few solutions) would be used, and the rest of the hard IP circuitry would be wasted (not even usable for any other purpose). In addition, some users may want to design their own communication protocols, the details of which cannot be fully anticipated and provided for with hard IP. Such non-industry-standard or customized protocols may use standard techniques such as 8B10B coding, but have different packet sizes, different header codes, and other custom features that tend to affect the synchronization aspects of communication more than the alignment aspects. This is another reason why synchronization may be better left to programmable logic 200/210. Moreover, it is practical to have programmable logic 200/210 handle synchronization because by the time the data reaches that logic, the clock rate of the data has been greatly reduced, from the serial bit-rate (as for the clock signal on lead 124), to the two-byte parallel clock rate associated with the data on leads 136. Alignment, on the other hand, is better handled in hard IP 100 (e.g., because of the involvement of high-speed clock signals like 124). The same is true for other basic and very common tasks of the types mentioned above in the description of hard IP data processing modules 170.

Returning to the interplay among signals 142, 152, 212, and 214, it may be desirable in some cases (i.e., for certain communication protocols) for FSM 210 to keep track of error indications in signals 142 and 152, and on that basis to decide when re-align control circuitry 160 should change or be allowed to change the byte alignment. For example, different communication protocols may have different numbers or frequencies of valid code errors (142) and/or CRD errors (152) that are to be recognized as indicating a need for re-alignment. These different error rules can be readily implemented by appropriately programming FSM 210. Thus FIG. 1 indicates that FSM 210 may count the number of valid codes that are detected by circuitries 140, and/or the number of invalid codes that are detected by those circuitries (e.g., because the communication protocol being implemented specifies that re-alignment should be done when a certain number of invalid codes is detected without a sufficient number of valid codes being detected). In the same vein, FIG. 1 indicates that FSM 210 may similarly monitor signals 152 with respect to CRD errors and/or attempted recovery from such errors. If the foregoing conditions (and/or any other factors FSM 210 may be monitoring) cause FSM 210 to conclude that hard IP 100 should re-align, FSM 210 can assert RESYNC_ENABLE signal 212 to cause re-align control circuitry 160 to produce a re-alignment of circuitry 130.

As another example of interplay among element 100 and 210, to speed up a re-alignment operation, FSM 210 may assert AUTO_RESYNC_MODE signal 214 when signals 142 and/or 152 have come close to indicating a need for re-alignment. As a specific illustration of this, suppose that the communication protocol being implemented specifies that under a certain condition a third invalid code 142 should trigger re-alignment. When FSM 210 detects two invalid codes 142 under those conditions, it can then assert AUTO_RESYNC_MODE 214. This enables circuitry 160 to begin a re-alignment as soon as it receives another invalid code signal 142. In this way, re-alignment can begin immediately after the next invalid code 142 while signal 214 is asserted and without having to wait for further processing of that next invalid code by data processing modules 170 and/or FSM 210.

As still another example of possible interplay among elements 100 and 210, if, as part of its synchronization function, FSM 210 has determined that the incoming signal is currently in the data-bytes portion of a packet, FSM 210 can suspend response to code errors 142 and continue to respond only to possible CRD errors 152.

Figure 2:
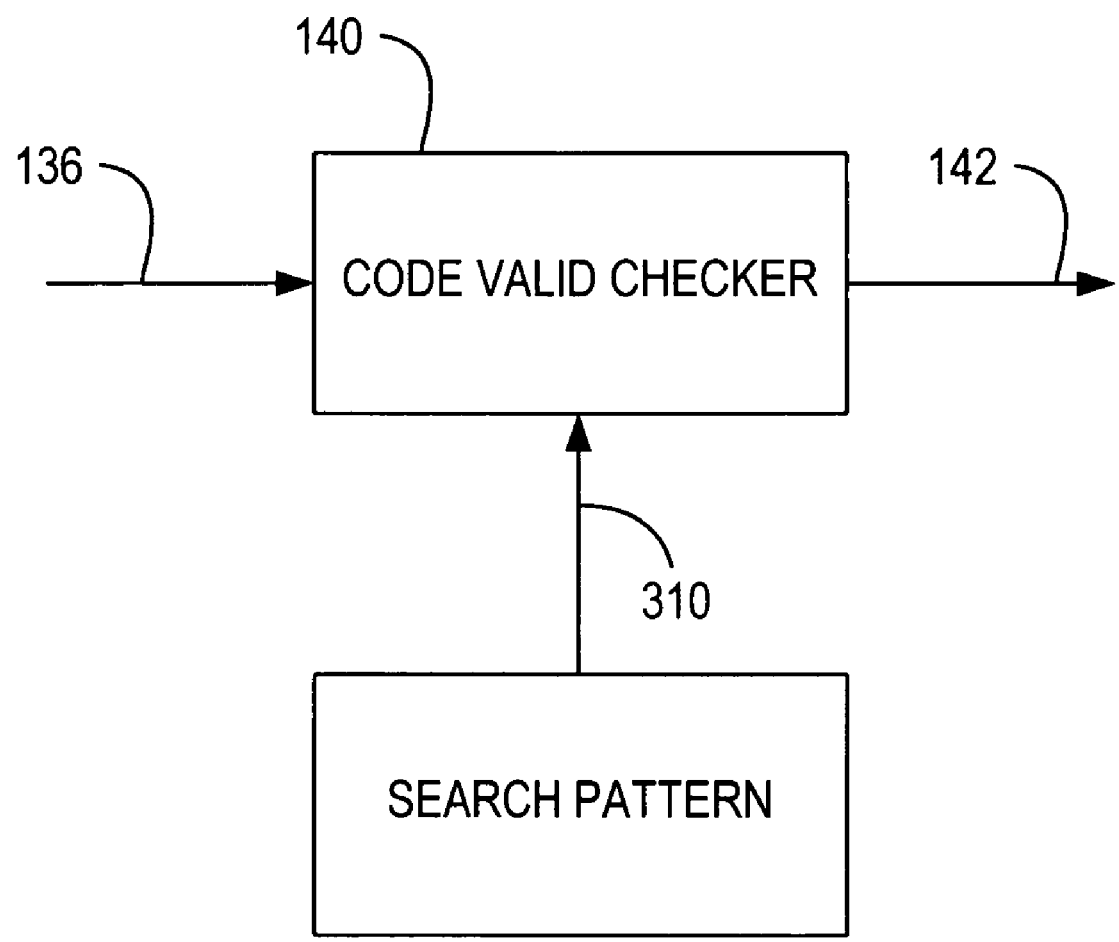
FIG. 2 is a simplified block diagram illustrating another possible aspect of the invention.

FIG. 2 illustrates the point that the byte code for which circuitry 140 checks can be any desired byte code provided by search pattern circuitry 310. For example, circuitry 310 can be programmable circuitry into which any desired byte code can be programmed. Thereafter, code valid checker circuitry 140 will test each byte 136 that it receives for correspondence to byte code 310, and will output a signal 142 indicative of whether or not such correspondence has been found. Thus, although hard IP 100 is largely hard-wired for or dedicated to performing particular tasks, FIG. 2 illustrates how certain aspects of those tasks can be made programmable or otherwise variable.

It will be understood that the foregoing is only illustrative of the principles of the invention, and that various modifications can be made by those skilled in the art without departing from the scope and spirit of the invention. For example, although it is preferred for hard IP 100 to operate on two bytes at a time, this could be altered in other embodiments. Hard IP could instead operate on only one byte at a time, or it could operate in parallel on a larger number of bytes such as three, four, or more.

What is claimed is:

1. Programmable logic device integrated circuitry comprising:
   hard IP circuitry including circuitry for receiving a serial data signal, making a number of successive bits of the serial data signal available in parallel, and selecting aligned bytes of data from the parallel bits; and
   general-purpose programmable logic circuitry that is configurable, in use, to receive the aligned bytes from the hard IP circuitry and to synchronize the aligned bytes in accordance with communication protocol parameters that are programmed into the programmable logic circuitry,
wherein the hard IP circuitry further includes:
first circuitry for detecting whether or not an aligned byte corresponds to a valid byte code,
second circuitry for applying an output signal of the first circuitry to the programmable logic circuitry, and
third circuitry that is selectively responsive to the output signal of the first circuitry for selecting which of the parallel bits will be tried as aligned bytes,
and wherein the third circuitry is responsive to a signal from the programmable logic circuitry with regard to how the third circuitry responds to the output signal of the first circuitry,
the programmable logic circuitry being configurable to base the signal from the programmable logic circuitry at least in part on processing of the output signal of the first circuitry by the programmable logic circuitry in accordance with communication protocol parameters that are programmed into the programmable logic circuitry.

2. The programmable logic device integrated circuitry defined in claim 1 wherein the hard IP circuitry further includes:
fourth circuitry for performing a current running disparity check on the aligned bytes.

3. The programmable logic device integrated circuitry defined in claim 1 wherein the hard IP circuitry selects, in parallel, two successive aligned bytes of data from the parallel bits.

4. The programmable logic device integrated circuitry defined in claim 3 wherein the hard IP circuitry further includes:
circuitry for detecting whether or not each of the two aligned bytes corresponds to a byte code.

5. The programmable logic device integrated circuitry defined in claim 3 wherein the hard IP circuitry further includes:
circuitry for performing a current running disparity check on each of the two aligned bytes.

6. The programmable logic device integrated circuitry defined in claim 3 further comprising:
circuitry for applying the two aligned bytes to the programmable logic circuitry in parallel.

7. The programmable logic device integrated circuitry defined in claim 1 wherein the signal from the programmable logic circuitry can enable the circuitry for selecting to respond to a particular next output signal of the circuitry for detecting.

8. The programmable logic device integrated circuitry defined in claim 2 further comprising:
circuitry for applying an output signal of the fourth circuitry to the programmable logic circuitry.

9. The programmable logic device integrated circuitry defined in claim 8 wherein the hard IP circuitry further includes:
fifth circuitry that is selectively responsive to the output signal of the fourth circuitry for selecting which of the parallel bits will be tried as aligned bytes.

10. The programmable logic device integrated circuitry defined in claim 9 wherein the fifth circuitry is responsive to a signal from the programmable logic circuitry with regard to how the fifth circuitry responds to the output signal of the fourth circuitry.

11. The programmable logic device integrated circuitry defined in claim 10 wherein the signal from the programmable logic circuitry enables the fifth circuitry to respond to a particular next output signal of the fourth circuitry.

12. The programmable logic device integrated circuitry defined in claim 1 wherein the hard IP circuitry further includes:
a data processing module for operating on the aligned bytes prior to the programmable logic circuitry, the first circuitry receiving the aligned bytes upstream from the data processing module.

13. The programmable logic device integrated circuitry defined in claim 12 wherein the data processing module is selected from the group consisting of channel deskew circuitry, rate matching circuitry, 8B10B decoding circuitry, and data width adjustment circuitry.

14. Programmable logic circuitry comprising:
hard IP circuitry including:
(1) circuitry for making a number of successively received serial data bits available in parallel, all of the serial data bits being received via a single serial data signal selected from the group consisting of a differential input signal pair and a single-ended input signal,
(2) circuitry for selecting aligned bytes of data from the parallel bits made available by the circuitry for making,
(3) code-valid-checker circuitry for detecting whether an aligned byte selected by the circuitry for selecting corresponds to a valid byte code, and
(4) CRD-error-checker circuitry for performing a current running disparity check on each aligned byte from the circuitry for selecting; and
programmable logic circuitry for receiving (1) the aligned bytes from the circuitry for selecting, (2) an output signal of the code-valid-checker circuitry, and (3) an output signal of the CRD-error-checker circuitry, the programmable logic circuitry being configurable to (a) synchronize the aligned bytes in accordance with communication protocol parameters that are programmed into the programmable logic circuitry, including use of at least one of the output signal of the code-valid-checker circuitry and the output signal of the CRD-error-checker circuitry to determine when changing aligned byte selection of the circuitry for selecting is needed, and (b) feed back to the hard IP circuitry a signal for affecting operation of the circuitry for selecting when the programmable logic circuitry determines that changing aligned byte selection of the circuitry for selecting is needed.

15. The programmable logic circuitry defined in claim 14 wherein the output signal of at least one of the code-valid-checker circuitry and the CRD-error-checker circuitry is applied to the circuitry for selecting for use in affecting the circuitry for selecting when that affecting is enabled by the signal fed back to the hard IP circuitry.

16. The programmable logic circuitry defined in claim 14 wherein the hard IP circuitry further includes:
a data processing module for operating on the aligned bytes prior to the programmable logic circuitry, the code-valid-checker circuitry and the CRD-error-checker circuitry receiving the aligned bytes upstream from the data processing module.

17. The programmable logic circuitry defined in claim 16 wherein the data processing module is selected from the group consisting of channel deskew circuitry, rate matching circuitry, 8B10B decoding circuitry, and data width adjustment circuitry.

18. Programmable logic circuitry comprising:

hard IP circuitry including:
  (1) circuitry for making a number of successively received serial data bits available in parallel, all of the serial data bits being received via a single serial data signal selected from the group consisting of a differential input signal pair and a single-ended input signal,
  (2) circuitry for selecting, in parallel, two aligned bytes of data from the parallel bits made available by the circuitry for making,
  (3) code-valid-checker circuitry for detecting whether each of the aligned bytes selected by the circuitry for selecting corresponds to a valid byte code, and
  (4) CRD-error-checker circuitry for performing a current running disparity check on each of the aligned bytes from the circuitry for selecting; and programmable logic circuitry for receiving (1) the aligned bytes from the circuitry for selecting, (2) output signals of the code-valid-checker circuitry, and (3) output signals of the CRD-error-checker circuitry, the programmable logic circuitry being configurable to (a) synchronize the aligned bytes in accordance with communication protocol parameters that are programmed into the programmable logic circuitry, including use of the output signals of both the code-valid-checker circuitry and the CRD-error-checker circuitry to determine when changing aligned bytes selection of the circuitry for selecting is needed, and (b) feed back to the hard IP circuitry a signal for affecting operation of the circuitry for selecting when the programmable logic circuitry determines that changing aligned bytes selection of the circuitry for selecting is needed.

19. The programmable logic circuitry defined in claim 18 wherein the output signals of at least one of the code-valid-checker circuitry and the CRD-error-checker circuitry are applied to the circuitry for selecting for use in affecting the circuitry for selecting when that affecting is enabled by the signal fed back to the hard IP circuitry.

20. The programmable logic circuitry defined in claim 18 wherein the hard IP circuitry further includes:
  a data processing module for operating on the aligned bytes prior to the programmable logic circuitry, the code-valid-checker circuitry and the CRD-error-checker circuitry receiving the aligned bytes upstream from the data processing module.

21. The programmable logic circuitry defined in claim 20 wherein the data processing module is selected from the group consisting of channel deskew circuitry, rate matching circuitry, 8B10B decoding circuitry, and data width adjustment circuitry.

* * * * *

UNITED STATES PATENT AND TRADEMARK OFFICE
CERTIFICATE OF CORRECTION

PATENT NO. : 7,598,767 B1 Page 1 of 1
APPLICATION NO. : 11/349411
DATED : October 6, 2009
INVENTOR(S) : Ning Xue It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 799 days.

Signed and Sealed this

Twenty-eighth Day of September, 2010

David J. Kappos
*Director of the United States Patent and Trademark Office*